United States Patent [19]
Lage et al.

[11] Patent Number: 5,285,093
[45] Date of Patent: Feb. 8, 1994

[54] SEMICONDUCTOR MEMORY CELL HAVING A TRENCH STRUCTURE

[75] Inventors: Craig S. Lage; Richard D. Sivan, both of Austin, Tex.

[73] Assignee: Motorola, Inc., Schaumburg, Ill.

[21] Appl. No.: 955,781

[22] Filed: Oct. 5, 1992

[51] Int. Cl.⁵ ............... H01L 29/10; H01L 29/78; H01L 27/02
[52] U.S. Cl. .................... 257/332; 257/329; 257/330; 257/331; 257/334; 257/374; 257/393; 257/401; 257/903
[58] Field of Search ............... 257/329, 330, 331, 332, 257/333, 334, 369, 374, 393, 401, 903, 904

[56] References Cited
U.S. PATENT DOCUMENTS

| | | | |
|---|---|---|---|
| 4,247,916 | 1/1981 | Erb | 365/182 |
| 4,683,643 | 8/1987 | Nakajima et al. | 437/203 |
| 4,810,906 | 3/1989 | Shah et al. | 307/448 |
| 4,890,144 | 12/1989 | Teng et al. | 357/23.4 |
| 4,951,102 | 8/1990 | Beitman et al. | 357/23.4 |
| 5,010,386 | 4/1991 | Groover, III | 357/42 |
| 5,016,070 | 5/1991 | Sundaresan | 257/331 |
| 5,122,848 | 6/1992 | Lee et al. | 357/23.6 |
| 5,198,683 | 3/1993 | Sivan | 257/331 |

OTHER PUBLICATIONS

Eklund, et al.; "A 0.5 μm BiCMOS Technology for Logic and 4 Mbit-Class SRAM's"; IEDM; pp. 425-428 (1989).

*Primary Examiner*—Ngan Ngo
*Attorney, Agent, or Firm*—Jasper W. Dockrey

[57] ABSTRACT

In one embodiment, a semiconductor memory cell (10) having a trench (24) and access transistor (54) formed in a well region (20). The trench (24) substantially contains an inverter (60) which is electrically coupled to ground and power signals by buried layers (12, 18) in the substrate (11). The inverter (60) has a toroidal, shared-gate electrode (40) which electrically controls a driver transistor (32) in the wall (26) of the trench (24), and a thin-film load transistor (42) in the central portion of the trench (24). A portion of the toroidal, shared gate electrode extends to an adjacent well region (20') and contacts well region (20') at cell node (13'). A ground signal is provided to load transistor (42) at the bottom surface (28) of the trench (42). A supply signal is provided by a buried layer (18) which is integral with driver transistor (32).

15 Claims, 11 Drawing Sheets

SEMICONDUCTOR MEMORY CELL HAVING A TRENCH STRUCTURE

FIELD OF THE INVENTION

This invention relates in general to semiconductor devices, and more particularly to semiconductor memory devices having trench structures.

BACKGROUND OF THE INVENTION

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory device (DRAM), or static-random-access-memory device (SRAM), the components must be arranged compactly if the overall device dimensions are not to become excessively large. This problem is especially critical in SRAM devices where a typical individual memory cell contains as many as six separate components.

One technique for reducing memory cell dimensions is to place a number of the components in a trench structure, which is sunk into the substrate. Components, such as resistors, capacitors, transistors, and the like, are packed into the trench leaving the remaining active surface area of the cell available for the formation of additional memory cell components. However, as memory devices continue to become more and more complex, there is a need to further reduce the size of the trench itself. This is necessary to allow the placement of even more memory cells in a given area of substrate surface. Because components such as transistors have a certain minimum number of functional components, i.e. a gate electrode, a source and drain region, and the like, new design techniques are needed to pack these components into an even smaller trench.

Even with careful component design and the integration of a trench structure into the memory cell, additional surface area is still necessary for remaining components. For example, active surface regions of the cell must be made available for the interconnection of leads providing supply and ground voltages to the cell. Simple down-sizing of interconnect components can only be pursued to the limit of the line-width definition capability of the manufacturing process. Once the line-width definition limits are reached, new design methodology must be employed if further reduction in memory cell area is to be achieved. Accordingly, a need existed for a new cell design which maximizes the utilization of available space inside the trench, and further reduces the amount of active surface area necessary for the formation of a ULSI semiconductor memory device.

SUMMARY OF THE INVENTION

In one embodiment of the present invention, a semiconductor memory cell has a substrate including a well region below the surface of the substrate. A trench resides in the substrate and has a bottom surface, a wall surface, and a central region. An inverter resides in the trench. The inverter includes a first channel region of a first conductivity type in the wall surface, a second channel region of a second conductivity type in the central region extending from the bottom surface to substrate surface, and a toroidal shared-gate electrode intermediate to the first and second channel regions. A first buried layer in the substrate is electrically coupled to the second channel region at the bottom surface of the trench. A second buried layer in the substrate, intermediate to the well region and the first buried layer, is electrically coupled to the first channel region. The first buried layer provides a first logic signal to the first channel region, and the second buried layer provides a second logic signal to the second channel region.

A process for fabricating the shared-gate electrode is provided which includes the deposition of a first conductive layer into the trench. A insulating layer is non-conformally deposited to overlie only the portion of the first conductive layer which overlies the surface of the well region. The first conductive layer is then anisotropically etched, using the insulation layer as an etch mask, to form the shared-gate electrode.

BRIEF DESCRIPTION OF THE DRAWINGS

FIGS. 2-1 through 2-5, illustrate, in cross-section, process steps in accordance with the invention for the fabrication of a semiconductor memory device according to the first embodiment of the invention;

FIG. 3, is a plan view of a semiconductor memory device in accordance with of the first embodiment of the invention;

FIG. 4, is a circuit diagram of a conventional semiconductor memory device for illustrating how the device of the present invention can be connected to form an SRAM device;

FIG. 5, illustrates, in cross-section, a second embodiment of a semiconductor memory device in accordance with the invention;

FIGS. 6-1 through 6-4, illustrate, in cross-section, process steps in accordance with the invention for the fabrication of a semiconductor memory device according to the second embodiment of the invention;

Figure 1:
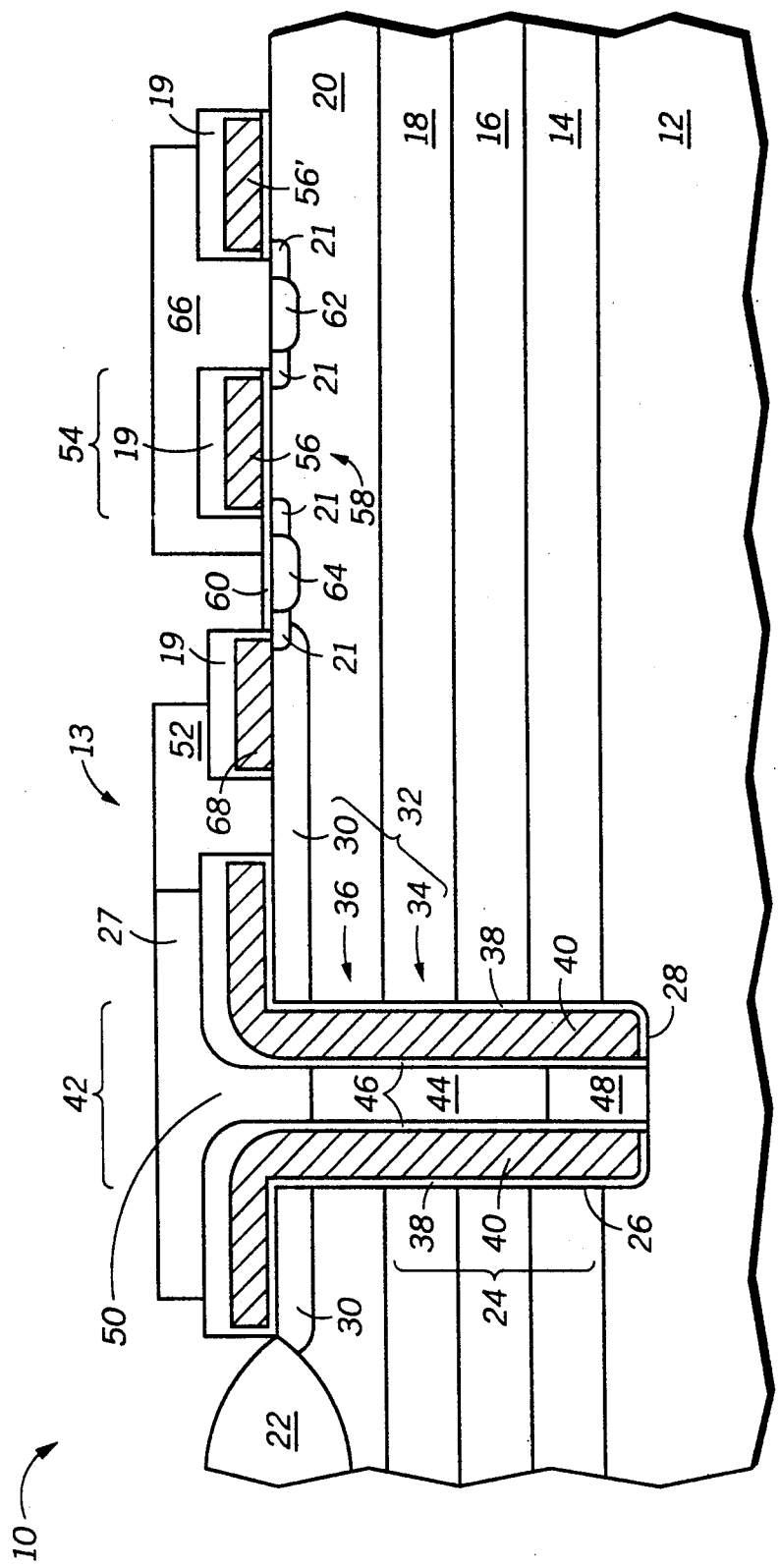
FIG. 1, illustrates, in cross-section, a first embodiment of a semiconductor memory device in accordance with the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

Shown in FIG. 1, in cross-section, is a first embodiment of a semiconductor memory cell 10. The memory cell may be a component of a VLSI or ULSI memory device such as a SRAM device, or a memory component of a microprocessor device having on-board memory, or the like. Furthermore, the memory device can be a MOS device or a BiCMOS device. The memory cell of the present invention provides a compact component arrangement which achieves a substantial reduction in overall cell size. A small cell area is achieved by placing an inverter, having a shared gate electrode, in a trench which is sunk into a multi-layered substrate. Buried layers in the substrate provide power and ground signals to the inverter. The fabrication of an inverter wholly contained within a trench, together with buried supply conduits, results in a substantial savings in the amount of substrate surface area normally required to build such a structure.

Memory cell 10 is fabricated on a multi-layer substrate 11 having a semiconductor body 12. Semiconductor body 12 can be, but is not limited to, mono-crystalline silicon, epitaxial silicon, or a silicon-on-insulator (SOI) substrate. Semiconductor body 12 is a P-type substrate for the purpose of illustrating the invention. However, those skilled in the art recognize that body 12 can be N-type, and that other doped semiconductor regions can also have the reverse conductivity type. A N-type buried layer 14 overlies P-type body 12, and a buried layer 16 overlies buried layer 14. Layers 14 and 16 are formed by a conventional epitaxial silicon deposition process. Layers 14 and 16 can be formed during the same epitaxial deposition cycle with an appropriate change of dopants during the deposition cycle. An N-type buried-ground layer 18 overlies P-type buried layer 16. N-type buried-ground layer 18 is formed by doping P-type buried layer 16 with an N-type dopant, such as phosphorus or arsenic. A P-type well region 20 overlies buried-ground layer 18 and is formed by an epitaxial silicon deposition process. An isolation region 22 resides in a portion of well region 20 and functions to electrically isolate various portions of well region 20 from one another. As will subsequently become apparent, the buried supply and ground layers serve to provide high and low logic signals to memory cell 10, while well region 20 serves as a region in which to construct access transistors and cell nodes.

Memory cell 10 has a trench 24 therein having a wall surface 26 and a bottom surface 28. An N-type drain region 30 is located in well region 20 and surrounds trench 24 immediately below the surface of well region 20. A driver transistor 32 is formed along wall surface 26 and includes drain region 30 and a source region 34 residing in a portion of buried-ground layer 18 adjacent to wall surface 24. A channel region 36 is formed from a portion of well region 20 adjacent to wall surface 26 separating drain region 30 and source region 34. A first gate dielectric layer 38 overlies wall surface 26 which in turn is covered by a shared-gate electrode 40. Because of the general circular geometry of trench 24, the functional components of driver transistor 32 surround trench 24. The general shape of driver transistor 32 is toroidal. Shared-gate electrode 40, surrounds a central portion of trench 24 while following the general circular contour of trench 24. Source and drain regions 30 and 34, and channel region 36 then surround shared-gate electrode 40.

A thin-film load transistor 42 occupies the central portion of trench 24. Load transistor 42 has a channel region 44 in the center of trench 24, which is separated from shared-gate electrode 40 by a second gate dielectric layer 46. In the illustrative embodiment, load transistor 42 is a P-channel device. A P-type source region 48 contacts semiconductor body 12 at bottom surface 28, and a P-type drain region 50 overlies channel region 44. Load transistor 42 is cylindrical shaped and is circumscribed by the toroidal body of driver transistor 32. Shared-gate electrode 40 lies intermediate to channel regions 36 and 44 and electrically controls current conduction in both transistors. Drain region 50 is electrically coupled to drain region 30 by an N-type contact extension 52. Contact extension 52 contacts well region 20 at drain region 30 forming a cell node 13.

An N-channel access transistor 54 resides in a portion of well region 20 and is electrically coupled to cell node 13 and drain region 30 by doped regions in the well. Access transistor 54 includes a gate electrode 56 overlying a channel region 58 and separated therefrom by a gate dielectric layer 60. A source region 62 and a drain region 64 are formed in well region 20 on either side of channel region 58. A bit-line contact land 66 overlies a portion of gate electrode 56 and contacts source region 62 at a surface portion of well region 20 adjacent to gate electrode 56. Contact land 62 also overlies a portion of an adjacent wordline 56'. Adjacent wordline 56' provides read and write signals to an adjacent memory cell (not shown). A cell interconnect 68 contacts drain region 30 at node 13. Cell interconnect 68 extends from an adjacent section of memory cell 10 and electrically couples the two sections of the cell (see FIG. 3).

Figures 1, 2:
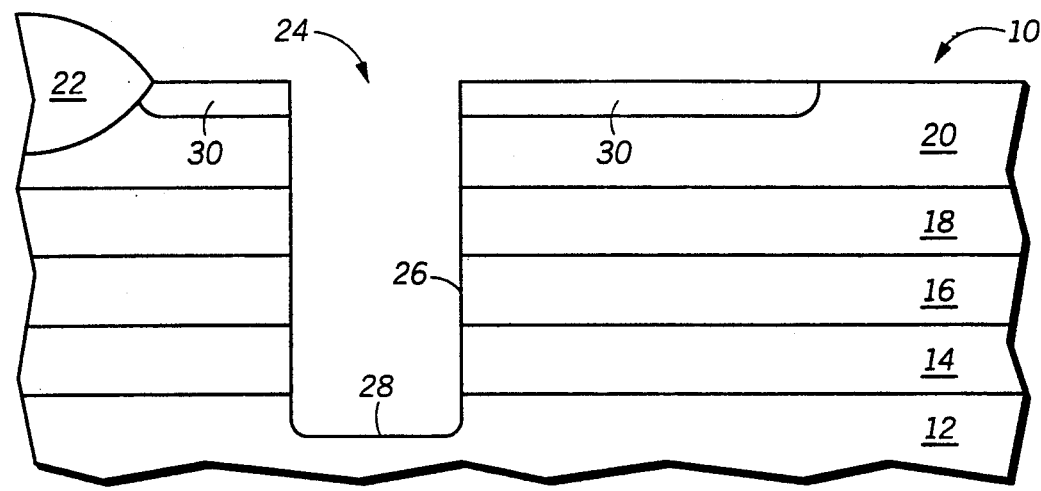
Figure 2:
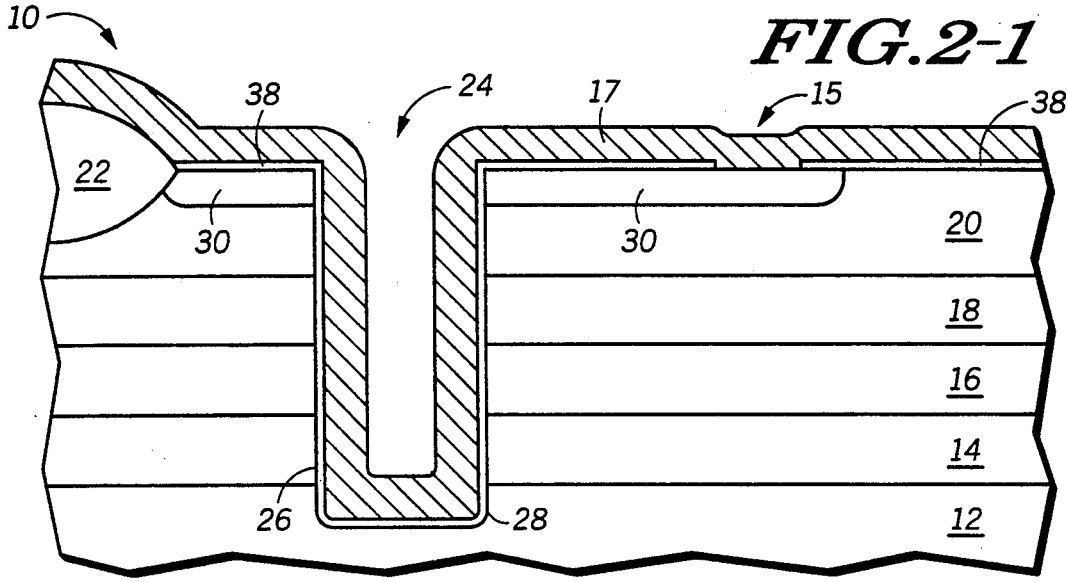

FIGS. 2-1 through 2-5, illustrate, in cross-section, process steps in the fabrication of memory cell 10. Referring to FIG. 2-1, the fabrication process begins by formation of buried-supply layer 14 and buried-ground layer 16 overlying semiconductor body 12. As previously described, preferably, an epitaxial silicon deposition process is used to form layers 14 and 16. In an alternative method, semiconductor body 12 can be doped with an N-type dopant and annealed to form N-type layer 14 at the surface of semiconductor body 12. An epitaxial deposition of a P-type silicon layer can then be used to form buried layer 16. Layer 16 is initially deposited to a greater thickness than illustrated in FIG. 2-1. Buried layer 18 is formed by a defining a portion of layer 16 with a photolithographic mask and ion implanting an N-type dopant into layer 16. After the implant, a thermal annealing cycle is used to activate the dopant atoms. A final epitaxial deposition is carried out to form an epitaxial layer overlying buried-ground layer 18. The epitaxial layer is photolithographically patterned and implanted to form P-type well region 20.

Although not shown in FIGS. 2-1 to 2-5, buried-ground layer 18 is only formed in selected portions of layer 16. The photolithographic process also defines regions adjacent to buried layer 18 having both N-type and P-type conductivity (not shown). These doped regions provide peripheral conduits through substrate 11 for electrical connection to buried layers 14, 16 and 18 by leads carrying $V_{SS}$ and $V_{DD}$ signals.

After forming well region 20, a field oxidation process is carried out to form isolation region 22. Although only one isolation region is illustrated in FIG. 2-1, many such regions are formed during the field oxidation process. The field oxidation process partitions well region 20 into many individual isolated regions. A memory cell, identical to memory cell 10 will be formed in each region. As will subsequently be described, in addition to partitioning well region 20 into cell region, portions of each cell region are also partitioned by isolation region 22.

Following the field oxidation process, a photomask is applied to well region 20 and an ion implant step is carried out to form N+ drain region 30. The implant photomask is removed and another etching photomask is applied to define the location of trench 24. The photomask is aligned to N+ drain region 30, and an anisotropic etch is performed to form trench 24 having a depth of about 1.5 to 3.0 microns. Preferably, reactive ion etching is used to form substantially vertical wall surfaces 26 and a slightly rounded bottom surface 28. Alternatively, an etching process such as electron cyclotron resonance etching can be used. Trench 24 exposes a portion of semiconductor body 12 at bottom surface 28. The exposed portion of semiconductor body 12 will be used for electrical connection of a supply signal to thin-film load transistor 42 which is to be constructed in trench 24. Prior to removing the etching photomask, an optional ion implant step can be performed to create a P-doped region in semiconductor body 12 below bottom surface 28. The P-doped region enhances the electrical connection between semiconductor body 12 and load transistor 42.

Once trench 24 is formed, a first gate dielectric layer 38 is formed over wall surface 26, bottom surface 28, and the surface of well region 20, as illustrated in FIG. 2-2. Preferably, first gate dielectric layer 38 is formed by a thermal oxidation process which oxidizes the silicon surfaces and forms a silicon dioxide layer having a thickness of about 50 to 200 angstroms. Alternatively, first gate dielectric layer 38 can be a silicon nitride layer, or an oxynitride layer, deposited by chemical vapor deposition. A thin layer of polysilicon is deposited to overlie the dielectric layer and a photomask is formed on the thin polysilicon. An etch is performed to form a contact opening 15 exposing a portion well region 20. After etching, the photomask is removed and a thick layer of polysilicon is deposited onto the thin polysilicon layer. The composite polysilicon layer forms a continuous conductive layer 17, which overlies trench 24 and contacts well region 20 through contact opening 15. After deposition, conductive layer 17 is preferably doped with phosphorus to be N-type conductive. Alternatively, conductive layer 17 can be doped during the second deposition step when the thick portion is deposited.

Figures 2, 3:
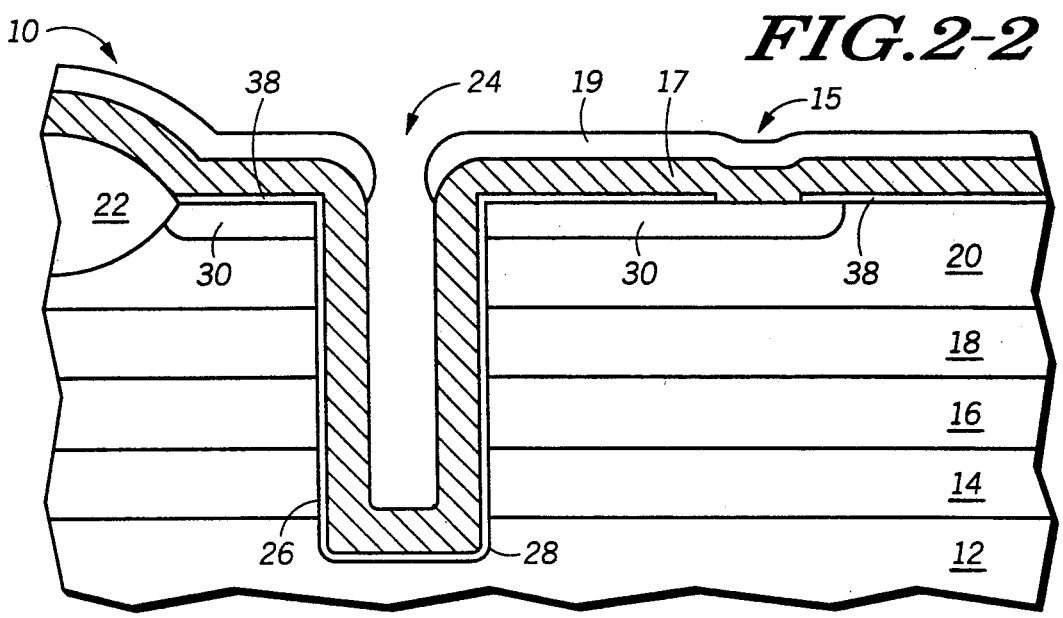

Following the deposition of conductive layer 17, an insulation layer 19 is deposited onto conductive layer 17, as illustrated in FIG. 2-3. In a preferred method, insulation layer 19 is formed using a deposition process that provides a non-conformal layer. Insulation layer 19 overlies the flat surface regions of conductive layer 17, but, does not cover vertical surfaces such as wall surface 26. To deposit insulation layer 19 non-conformally, an atmospheric silane deposition process can be used, for example, to deposit a layer of silicon oxide. Similarly, silicon nitride can be non-conformally deposited using an atmospheric deposition process. Alternatively, a plasma deposition process using tetraethylorthosilicate (TEOS) as a deposition gas can be used to deposit insulation layer 19 in a non-conformal manner. As a result of the non-conformal deposition process, insulation layer 19 does not significantly extend into trench 24. Therefore, upon completion of the deposition process, bottom surface 28 and wall surface 26 of trench 24 are virtually not covered by insulation layer 19.

An alternative method for forming insulation layer 19 having the characteristics illustrated in FIG. 2-3 includes depositing a silicon nitride layer filling trench 24 and overlying conductive layer 17. The silicon nitride layer is etched-back leaving a plug in trench 24. An oxidation process is carried out to form insulation layer 19 and the silicon nitride plug is removed.

Figures 2, 3, 4:
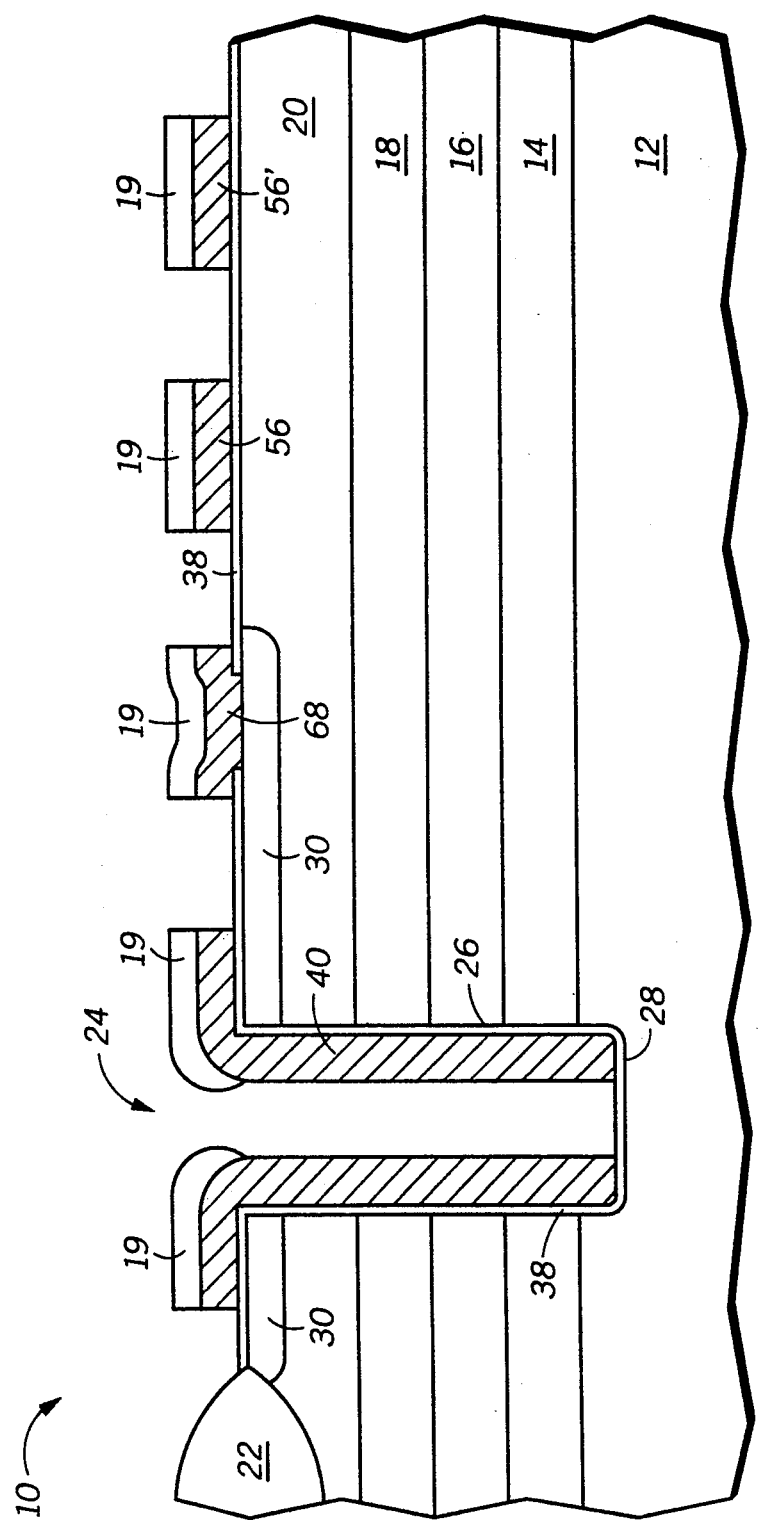

The process continues with the removal of a portion of conductive layer 17 overlying bottom surface 28, as illustrated in FIG. 2-4. Preferably, the portion of conductive layer 17 is removed by anisotropically etching conductive layer 17 using insulation layer 19 as an etching mask. The highly directional characteristics of the etch process result in the removal of etchable material overlying horizontal surfaces, but leaves material overlying vertical surfaces unetched. During the anisotropic etching process, a portion of insulation layer 19 is also removed; however, insulation layer 19 is of sufficient thickness such that substantially all of layer 19 remains once the etching process is complete. Alternatively, a sputter etching process can also be used to remove the portion of conductive layer 17 overlying bottom surface 28.

Next, a photomask is formed on insulation layer 19 and bottom surface 28, and an anisotropic etch is performed to pattern both insulation layer 19 and remaining portions of conductive layer 17. The etching process forms a shared-gate electrode 40 which overlies wall surface 26 and a portion of well region 20 adjacent to trench 24. Shared-gate electrode 40 is separated from wall surface 26 and bottom surface 28 by first gate dielectric layer 38. The etch process also forms gate electrode 56 and cell interconnect 68. Gate electrode 56 overlies a portion of first gate dielectric layer 38 adjacent to drain region 30 and cell interconnect 68 extends through opening 15 in first dielectric layer 38 and contacts drain region 30.

Following the formation of gate electrodes 40 and 56, and cell interconnect 68, a photomasking and ion implant process are carried out to form an N-type, lightly-doped drain region 21 in well region 20 on either side of gate electrode 56. Once drain region 21 is formed, a second gate dielectric layer 46 is formed over shared-gate electrode 40, as illustrated in FIG. 2-5. Preferably, second gate dielectric layer 46 is formed by the thermal oxidation of shared-gate electrode 40. Alternatively, second gate dielectric layer 46 can be an oxide-nitride-oxide layer (ONO) formed by a combination of thermal oxidation, followed by the sequential chemical vapor deposition of silicon nitride and silicon dioxide. During either the oxidation process or the ONO formation process, a sidewall layer is formed on shared-gate electrode 40, gate electrode 56, and cell interconnect 68. The sidewall layer electrically isolates these features from additional conductive layers subsequently deposited during the formation of memory cell 10.

In accordance with the invention, the formation of a thin-film load transistor 42 begins with the deposition of a first polysilicon layer 25 followed by a photomasking and ion implant step to form source and drain regions 62 and 64. Preferably, first polysilicon layer 25 is chemical vapor deposited to a thickness of about 100 to 500 angstroms. Next, an etching step is carried out to form a selected pattern, as illustrated in FIG. 2-5. The directional etch leaves portions of first polysilicon layer 25 overlying shared-gate electrode 40 in trench 24, and overlying the sidewalls of cell interconnect 68.

Once selected portions of polysilicon layer 25 are etched away, the etch chemistry is changed and exposed portions of first dielectric layer 38 are removed. During the etching process, the portion of first gate dielectric layer 38 overlying bottom surface 28 is removed exposing a portion of semiconductor body 12. The etch also removes exposed portions of first gate dielectric layer 38 between shared-gate electrode 40 and cell interconnect 68, and between gate electrode 56 and adjacent wordline 56'.

Referring back to FIG. 1, the formation of thin-film load transistor 42 is completed by depositing a second polysilicon layer 27, which contacts semiconductor body 12 at bottom surface 28 and fills the central portion of trench 24. The polysilicon layers 25 and 27 form a continuous, conductive, thin-film layer. After the deposition of second polysilicon layer 27, a P+ implant photomask is applied and an ion implant step is carried out to form a P-type drain region 50 in second polysilicon layer 27. Next, an N+ photomask is applied and an ion implant step is carried out to form an N+ contact extension 52 between drain region 50 and drain region 30. Source region 48 is formed by a thermal annealing process to diffuse P-type dopant atoms from semiconductor body 12 into a portion of second polysilicon layer 27 adjacent to bottom surface 28. A channel region 44 resides in second polysilicon layer 27 intermediate to P+ source and drain regions 48 and 50. Driver transistor 32 and load transistor 42 comprise an inverter 60, which is completely contained within trench 24.

As an additional, and optional process step, a silicide layer can be formed at the surface of second polysilicon layer 27. The silicide layer will enhance the electrical conductivity of load transistor 42 and minimize diode characteristics caused by the P/N junction between drain region 50 and contact extension 52. The silicide layer (not shown) can be formed by chemical vapor deposition of a refractory metal, followed by thermal annealing. Alternatively, a refractory metal can be sputter deposited prior to annealing.

Those skilled in the art appreciate that in the foregoing embodiment of the invention, inverter 60, cell interconnect 68, and access transistor 54 have been formed using only two levels of conductive material. The formation of the functional elements of a memory cell with two conductive layers results in a memory cell having a minimal vertical height above the surface of the well region. By fabricating a memory cell having such a small vertical height, the process reliability is improved. The small vertical distance provides a minimum "step height" in the surface topography, which enables more reliable photolithographic processing and better quality metallization coverage. This aspect of the invention becomes important when additional, conventional processing steps are used to provide passivation and metal interconnects overlying the memory cell.

It is also appreciated that inverter 60 can be integrated into another type of semiconductor device other than an SRAM device. Inverter 60 can be used in any semiconductor device for the purpose of inverting a logic signal from a high level to a low level and visa verse.

A plan view of memory cell 10 is shown in FIG. 3. It is appreciated that this is only one possible layout and other possibilities exist for the arrangement of memory cell 10. Load transistor 42 is shown residing in trench 24 which is located in well region 20. Node 13 connects a corresponding load transistor 42' to active region 20. Load transistor 42' is located in an adjacent well region 20' on the opposite side of memory cell 10. Access transistor 54 is formed by a section of wordline 57 crossing over well region 20 adjacent to node 13. A second access transistor 54' is formed where wordline 57 overlies well region 20'. Adjacent wordline 56' also overlies a portion of well region 20 and is substantially parallel to wordline 57. Bit-line contact land 66 overlies portions of wordlines 56' and 57. The cross-sectional view illustrated in FIG. 1 is taken along the section line 1—1, shown in FIG. 3.

A schematic circuit diagram of memory cell 10 is shown in FIG. 4. Those skilled in the art recognize the circuit diagram as that of a standard six transistor SRAM circuit. Although the six transistor SRAM circuit is known, the formation of inverters for this circuit in trench structures having shared-gate electrodes provides a considerable reduction in chip area required to construct the SRAM circuit. The SRAM circuit includes two cross-coupled inverters 60 and 60'. Inverter 60 is formed by driver transistor 32 and load transistor 42. Driver transistor 32 and load transistor 42 have a common gate electrode (shared-gate electrode 40) which is coupled to cell node 13'. Similarly, the common gate electrode of inverter 60' is cross-coupled to inverter 60 at cell node 13. The cross-coupling of inverters 60 and 60' is shown in the plan view of FIG. 3, where cell interconnects 68 and 68' extend between well regions 20 and 20'. Cell interconnects 68 and 68' are extensions of the toroidal-shaped, shared-gate electrodes 40 and 40', which proceed away from trenches 24 and 24', respectively, and extend to the adjacent well region. As shown in FIG. 4, cell node 13 couples the drain region of access transistor 54 to the drain regions of driver transistor 32 and load transistor 42. Cell node 13 is illustrated in the plan view of FIG. 3, where cell interconnect 68 contacts well region 20. As illustrated in the cross-sectional view of FIG. 1, drain region 30 of driver transistor 32 and drain region 64 of access transistor 54 reside in well region 20 where cell interconnect contacts to well region 20. Corresponding structures are also formed in the opposite side of memory cell 10.

Power and ground signals are provided to memory cell 10 by buried layers 12, 14, 16, and 18, shown in FIG. 1. A power supply signal, denoted $V_{DD}$ in FIG. 4, is provided to inverters 60 and 60' by buried layer 12, shown in FIG. 1. The connection of buried layer 12 to source region 48 of load transistor 24, for example, is made at the bottom of trench 24 where source region 48 contacts semiconductor body 12. A corresponding structure (not shown) exists for inverter 60' in well region 20'. A ground signal, denoted $V_{SS}$ in FIG. 4, is provided to inverters 60 and 60' by buried layer 18, shown in FIG. 1. The ground connection to driver transistor 32, for example, is made by integrating source region 34 with buried ground layer 18.

The inventive arrangement, which is achieved by placing the inverters in alternately opposed trench structures and providing power and ground supply connections through buried layers in the substrate, results in a memory cell requiring a minimal amount of substrate surface area. Moreover, the implementation of toroidal, shared-gate electrodes for the inverters, which are interconnected by cell interconnects integral with the shared-gate electrode, further reduces the surface area needed to construct memory cell 10.

Figures 2, 3, 4, 5:
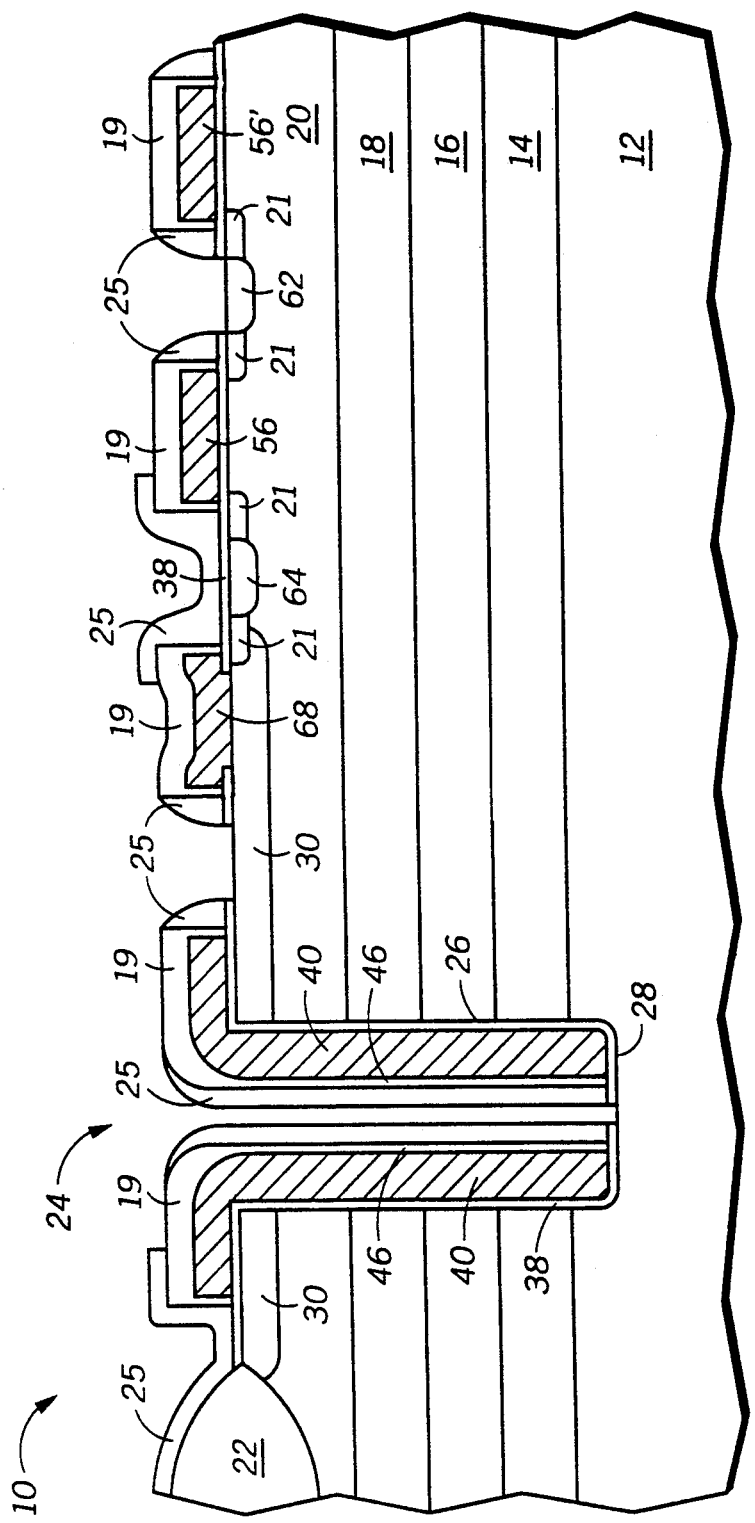
Figure 3:
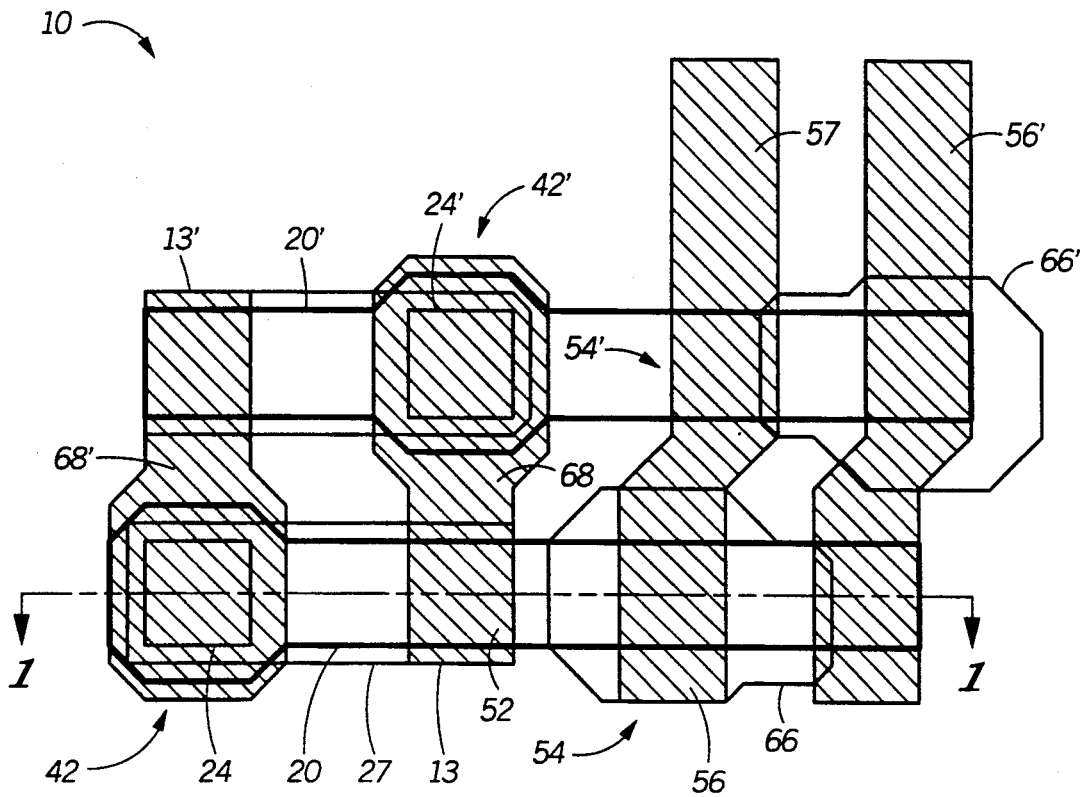
Figure 4:
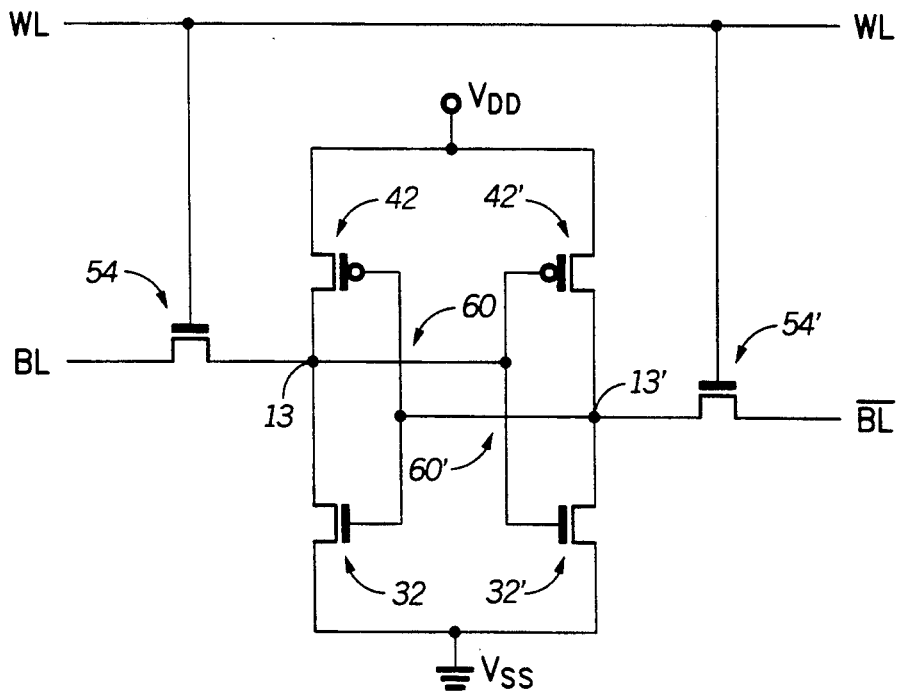
Figure 5:
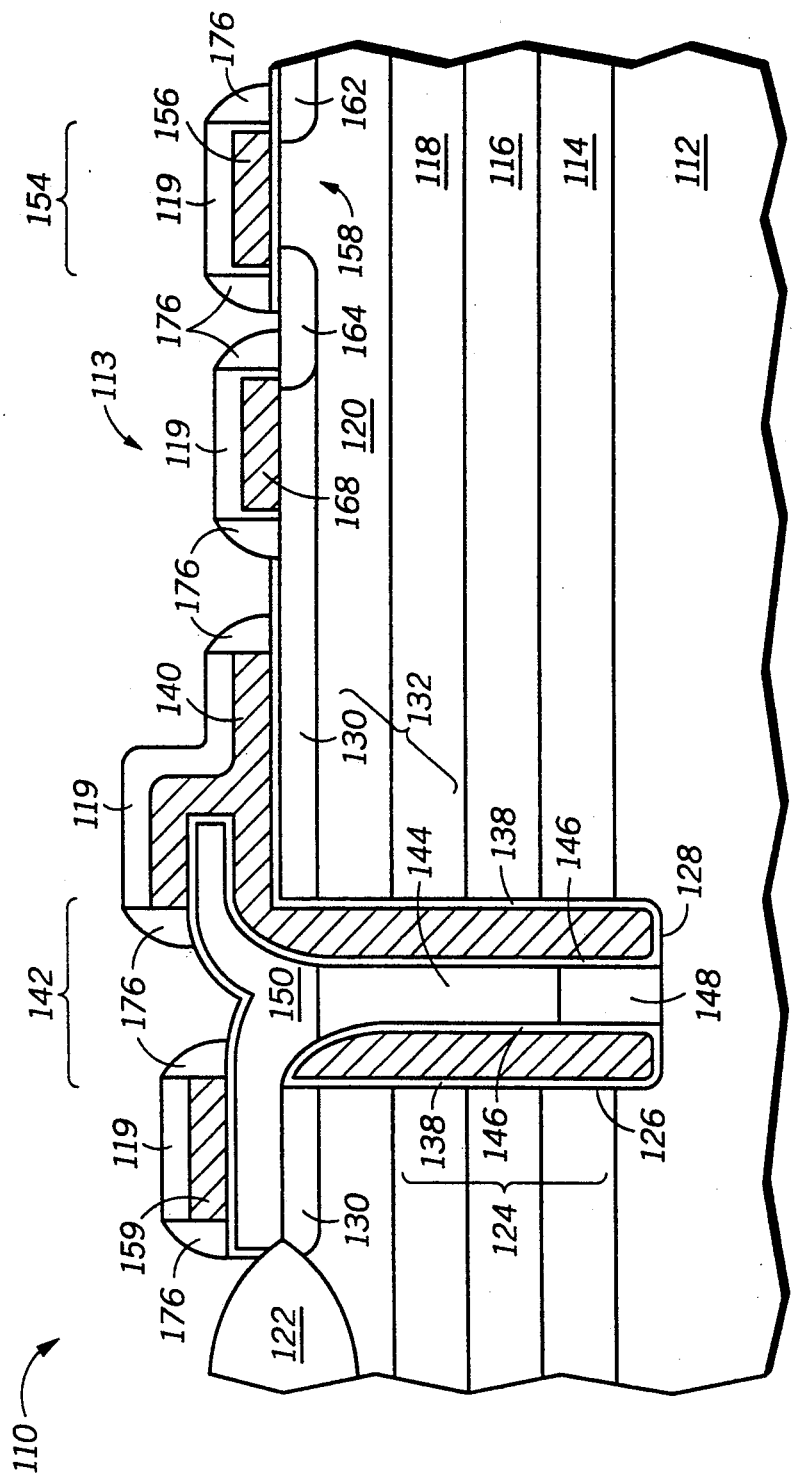

A second embodiment of the invention, which has a split wordline configuration, is illustrated, in cross-section, in FIG. 5. A memory cell 110 has a load transistor 142 and a driver transistor 132 formed in a trench 124. A shared-gate electrode 140 is formed along the wall surface 126 of trench 124 and extends out of trench 124 to overlie a portion of well region 120 and drain region 130. Driver transistor 132 is formed along the wall surface 126 and includes a drain region 130 formed in well region 120, which surrounds trench 124. Drain region 150 of load transistor 142 contacts drain region 130 of driver transistor 132 at the surface of well region 120 adjacent to trench 124. Together, driver transistor 132 and load transistor 142 form an inverter 160 which is substantially contained within trench 124.

A cell interconnect 168 contacts well region 120 intermediate to shared gate electrode 140 and an access transistor 154. Cell interconnect 168 is electrically coupled to driver transistor 132 and access transistor 154 by drain regions 130 and 164 in well region 120. Access transistor 154 has a wordline gate electrode 156 overlying a portion of a first dielectric layer 138. A second wordline 159 overlies a portion of drain region 150 and is separated therefrom by second gate dielectric layer 146. Second wordline 159 forms a second access transistor 154' where it crosses over an adjacent well region 120' (see FIG. 7).

Figures 1, 6:
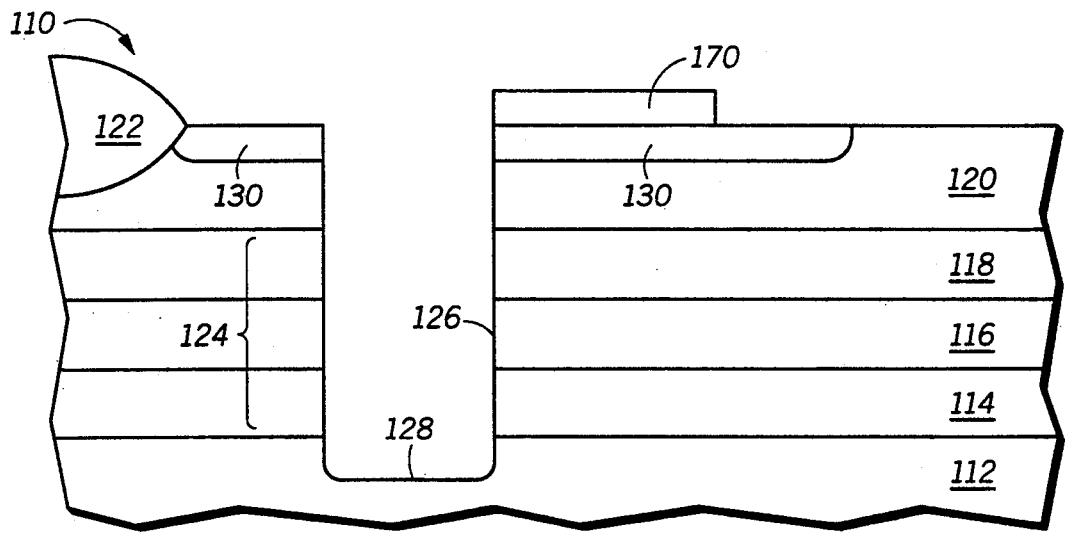
Figures 2, 6:
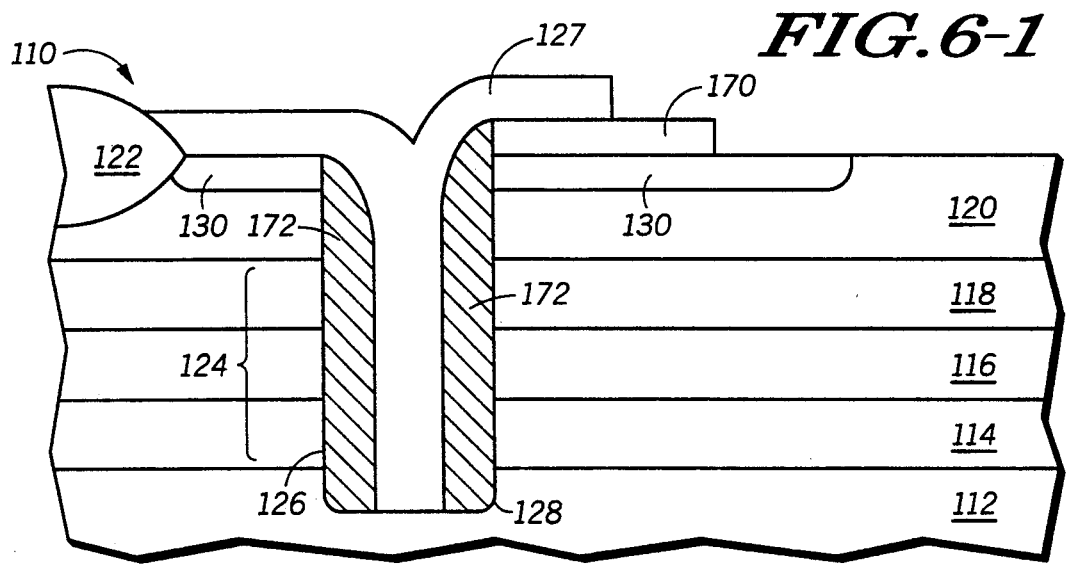
Figures 3, 6:
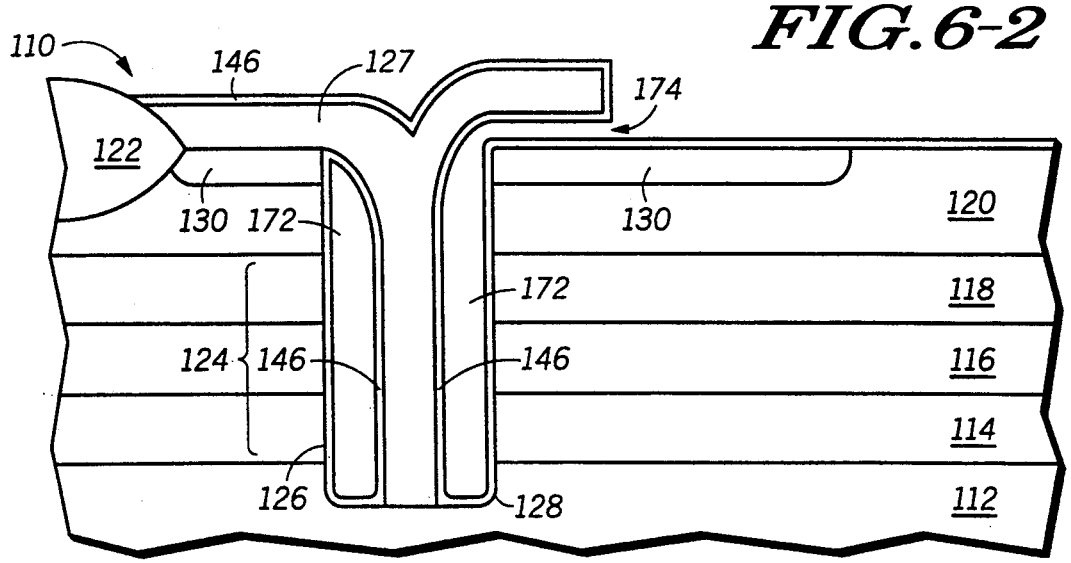
Figures 4, 6:
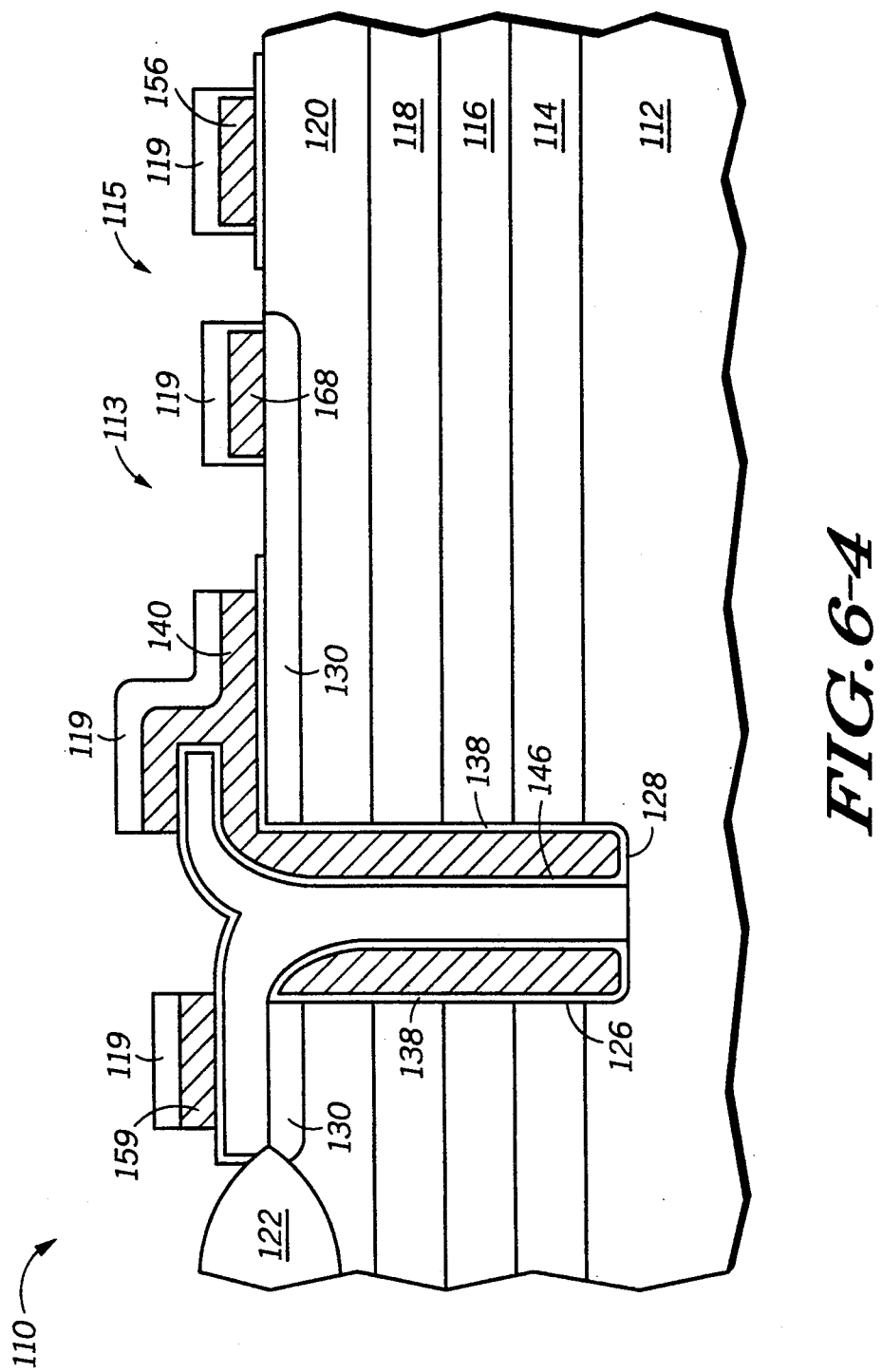

FIGS. 6-1 through 6-4, illustrate, in cross-section, process steps in accordance with the invention for the fabrication of the split wordline embodiment shown in FIG. 5. Referring to FIG. 6-1, a semiconductor body 112 having sequential overlying buried layers 114, 116, 118, and a well region 120 is provided in accordance with the procedures previously described for the fabrication of memory cell 10. Additionally, the processing steps used to form isolation region 122 and drain region 130 have been previously described in the foregoing embodiment. Continuing with the process for the present embodiment, a thick oxide layer is deposited onto well region 120. A photomask is applied and the unprotected portions of the silicon oxide layer are etched away leaving oxide layer 170. Then, another photomask is applied and a second etch step is performed to etch a trench 124 through oxide layer 170 and buried layers 118, 116, and 114 to expose a portion of semiconductor body 112. Portions of buried layers 118, 116, and 114 and well region 120 are exposed at a wall surface 126, and semiconductor body 112 is exposed at a bottom surface 128.

After trench 124 is formed, a second oxide layer is deposited and etched back to form a sidewall spacer 172 along wall surface 126, as shown in FIG. 6-2. It should be noted that a portion of sidewall spacer 172 extends to the upper surface of oxide layer 170, while the remaining portions of sidewall spacer 172 extend to the surface of well region 120. After sidewall spacer 172 is in place, a blanket layer of polysilicon is deposited by chemical vapor deposition to a sufficient thickness to insure that trench 127 is completely filled with polysilicon. A photomask is applied and the polysilicon layer is etched to form a thin-film layer 127. Thin-film layer 127 is spaced apart from wall surface 126 by sidewall spacer 172, and also from a portion of well region 120 by oxide layer 170.

Once thin-film layer 127 has been formed, a photomask is applied which exposes only the area in the immediate vicinity of trench 124. Then, an oxide etch process is used to remove both oxide layer 170 and sidewall spacer 172. Preferably, a temperature-controlled, buffered hydrogen fluoride solution is used to selectively remove silicon dioxide while not etching doped polysilicon. As illustrated in FIG. 6-3, the removal of oxide layer 170 and sidewall spacer 172 leaves thin-film layer 127 occupying a central portion of trench 124. The portion of thin-film layer 127 formerly overlying oxide layer 170 is now cantilevered over well region 120. As illustrated in FIG. 6-3, the etch process etches away oxide layer 170 leaving a gap 174 between the cantilevered portion of thin-film layer 127 and well region 130.

After the oxide etch is complete, the photomask is removed and an oxidation process is performed to form a dielectric layer on all exposed surface regions of thin-film layer 127, trench 124, and well region 120. During the oxidation process, gaseous oxygen passes through gap 174 and into trench 124 where the oxygen reacts with the exposed silicon surfaces. The oxidation process forms a first gate dielectric layer 138 on wall surface 126, bottom surface 128, and extending onto well region 120. In addition, the oxidation process forms a second gate dielectric layer 146 overlying all exposed surface regions of thin-film layer 127.

Following the oxidation process, shared-gate electrode 140, cell interconnect 168, wordline gate electrode 156, and second wordline 159 are formed having an overlying insulation layer 119, as illustrated in FIG. 6-4. The gate electrodes and wordlines are formed by a sequential deposition process in which a first thin layer of polysilicon is chemical vapor deposited, followed by an intermediate photomasking and etching step. Then, a second polysilicon deposition step is used to deposit a layer of polysilicon onto the first polysilicon layer forming a composite layer. Finally, an insulation layer is deposited onto the composite polysilicon layer and both the insulation layer and the underlying composite polysilicon layer are etched.

To fill trench 124 with polysilicon, a conformal chemical vapor deposition process is used. During the deposition process, as in the foregoing oxidation process, gaseous silicon passes through gap 174 into trench 124. A layer of silicon is deposited on dielectric layers 138 and 146 which then provides a surface for successive layers of silicon to be deposited. The successively deposited silicon layers eventually fill the space formerly occupied by sidewall spacer 172, and extend over well region 120 covering thin-film layer 127. An N-type dopant such as phosphorus is added to the deposition gas to dope the polysilicon as it is deposited.

The intermediate etching step, performed after the first polysilicon deposition, etches gate dielectric layer 138 to form a contact opening 115, which exposes a portion of well region 120. The deposition of a layer of polysilicon, prior to applying a photomask for the etch prevents photoresist from coming into direct contact with dielectric layer 138. The polysilicon layer advantageously prevents contaminants, such as heavy metals and sodium, in the photoresist from diffusing into the dielectric layer.

Referring back to FIG. 5, source and drain regions 162 and 164 are formed in well region 120 and sidewall spacers 176 are formed on the gate electrodes and wordlines. The spacers are formed by depositing a layer of insulating material, such as silicon oxide or silicon nitride, and anisotropically etching the insulating material.

Figure 7:
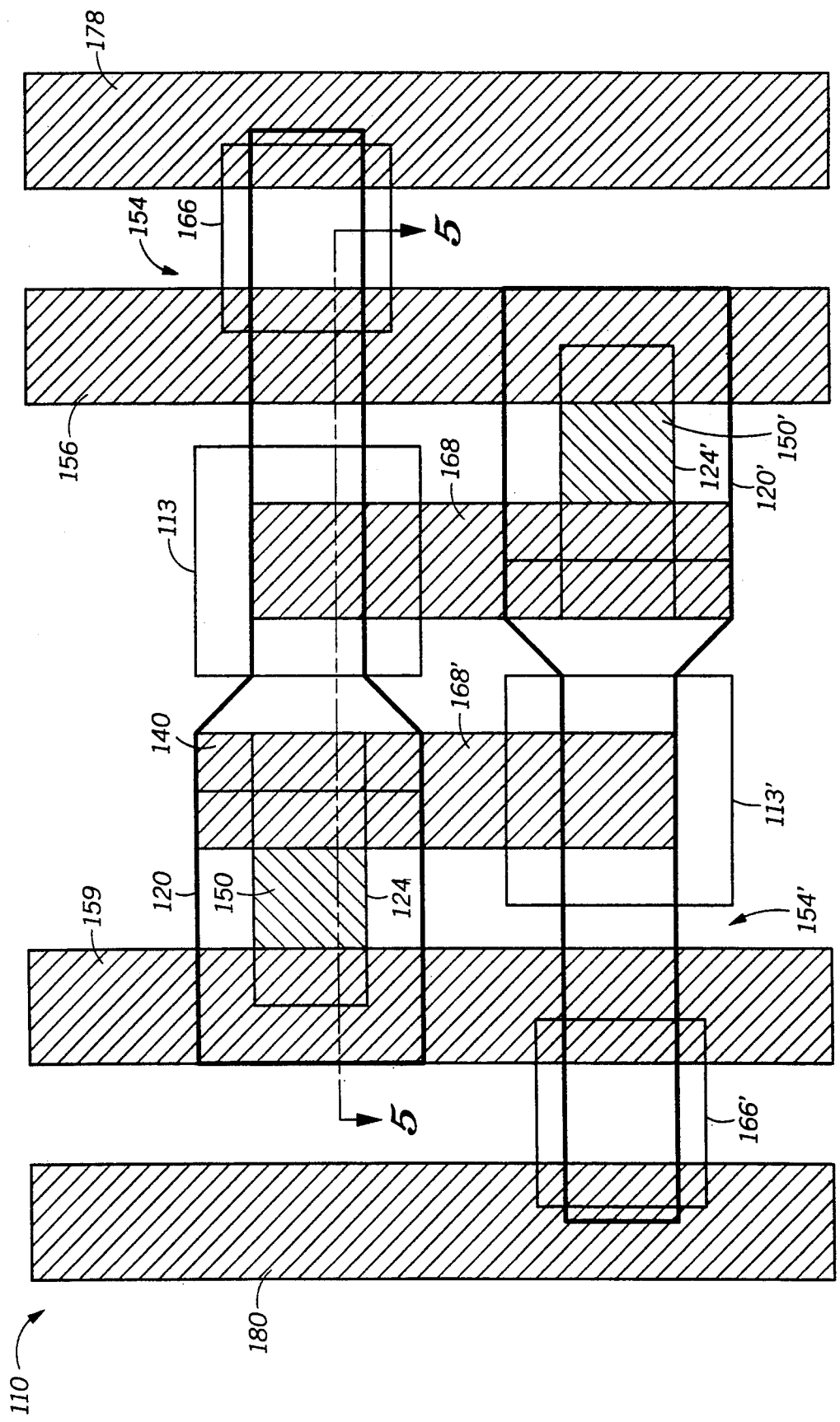
FIG. 7, is a plan view of a semiconductor memory device in accordance with the second embodiment of the invention.

A plan view of memory cell 110 is illustrated in FIG. 7. Memory cell 110 is bounded on two sides by wordline 156 and second wordline 159. Well region 120 and corresponding well region 120' are electrically coupled by cell interconnects 168 and 168'. Cell interconnect 168 is integral with shared-gate electrode 140', located in well region 120', and extends to well region 120, where it contacts well region 120 at cell node 113. Similarly, as a result of the symmetrical characteristics of memory cell 110, cell interconnect 168' is integral with shared-gate electrode 140, and extends to well region 120' and contacts well region 120' at cell node 113'. Access transistor 154 resides in well region 120 adjacent to cell node 150 at the point where wordline 154 crosses over well region 120. Similarly, access transistor 154' resides in well region 120' adjacent to cell node 113' at the point where wordline 159 crosses over well region 120'. A bit-line contact land 166 overlies a portion of wordline 156 and an adjacent wordline 178. Bit-line contact land 166 contacts source region 162 of access transistor 154. A corresponding bit-line contact land 166' overlies a portion of wordline 159 and an adjacent wordline 180, and contacts the source region of access transistor 154'. Adjacent wordlines 178 and 180 provide wordline signals to adjacent memory cells not shown in FIG. 7. A circuit diagram of memory cell 110 appears substantially the same as that shown in FIG. 4.

As in the previous embodiment, the placement of both driver transistors and load transistors in trenches 124 and 124', together with providing power and ground connections to memory cell 110 through buried layers 112, 114, 116, and 118, reduces the amount of surface area required to construct the memory cell. The split wordline construction of the present embodiment has the advantage of providing a more symmetrical cell resulting in better cell stability.

Referring to both FIGS. 7 and 5, FIG. 5 illustrates a sectional portion of memory cell 110 taken along the section line 5—5 of FIG. 7. The construction method used to fabricate memory cell 110 permits wordline 159 to be placed over drain region 150 of load transistor 142 without incurring excessive height in the cell. It is important that the cell not become excessively large in the vertical dimension. As previously described, this is because subsequent metal interconnects must traverse the surface of memory cell 110 to provide bit-line signals to lands 166 and 166'. Where rough topography exists over the memory cell, breaks in the metal leads can develop where the leads pass over underlying structure. The breaks cause open circuits and loss of cell functionality.

Figure 8:
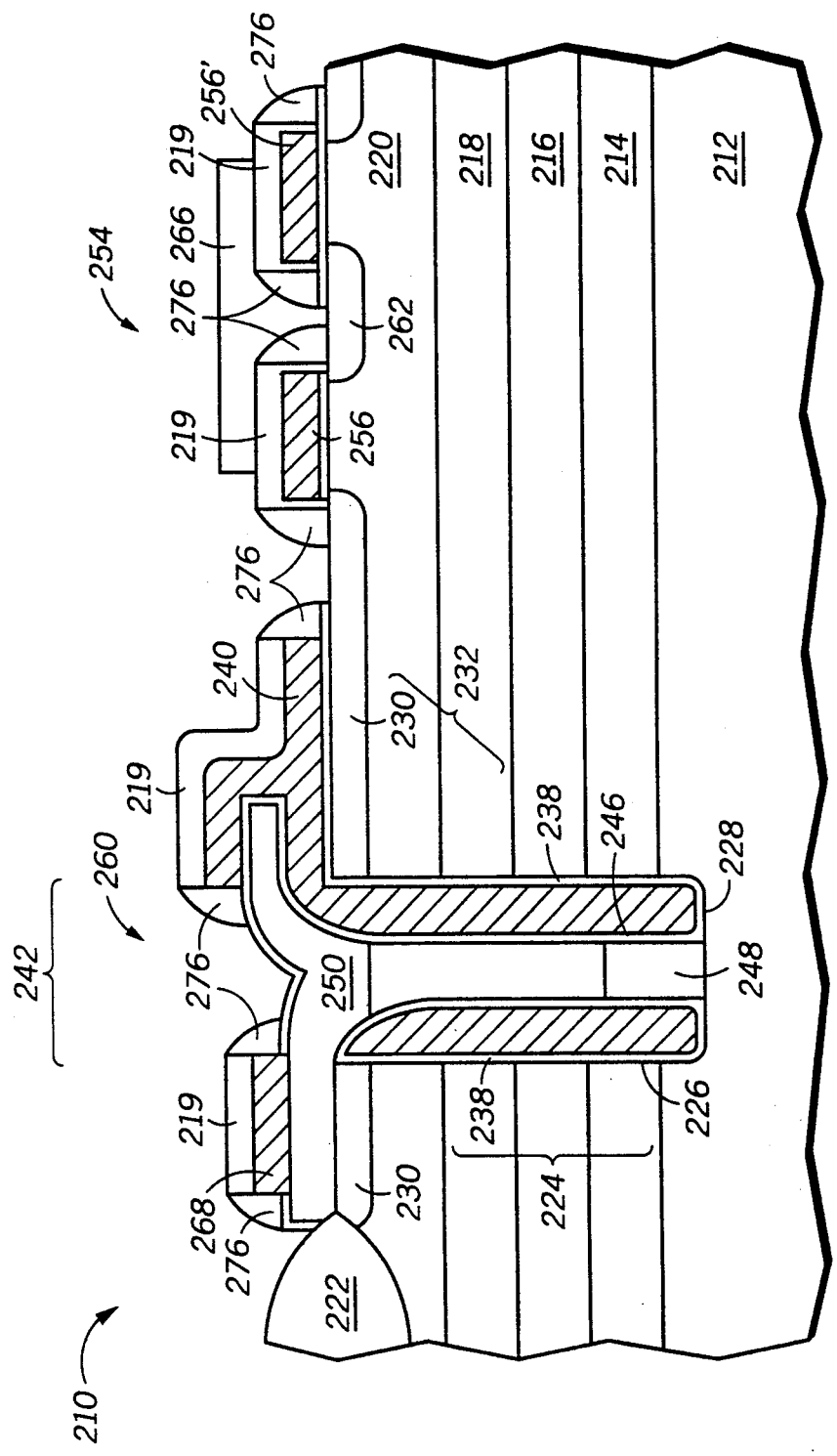
FIG. 8, illustrates, in cross-section, a third embodiment of a semiconductor memory device in accordance with the invention.
Figure 9:
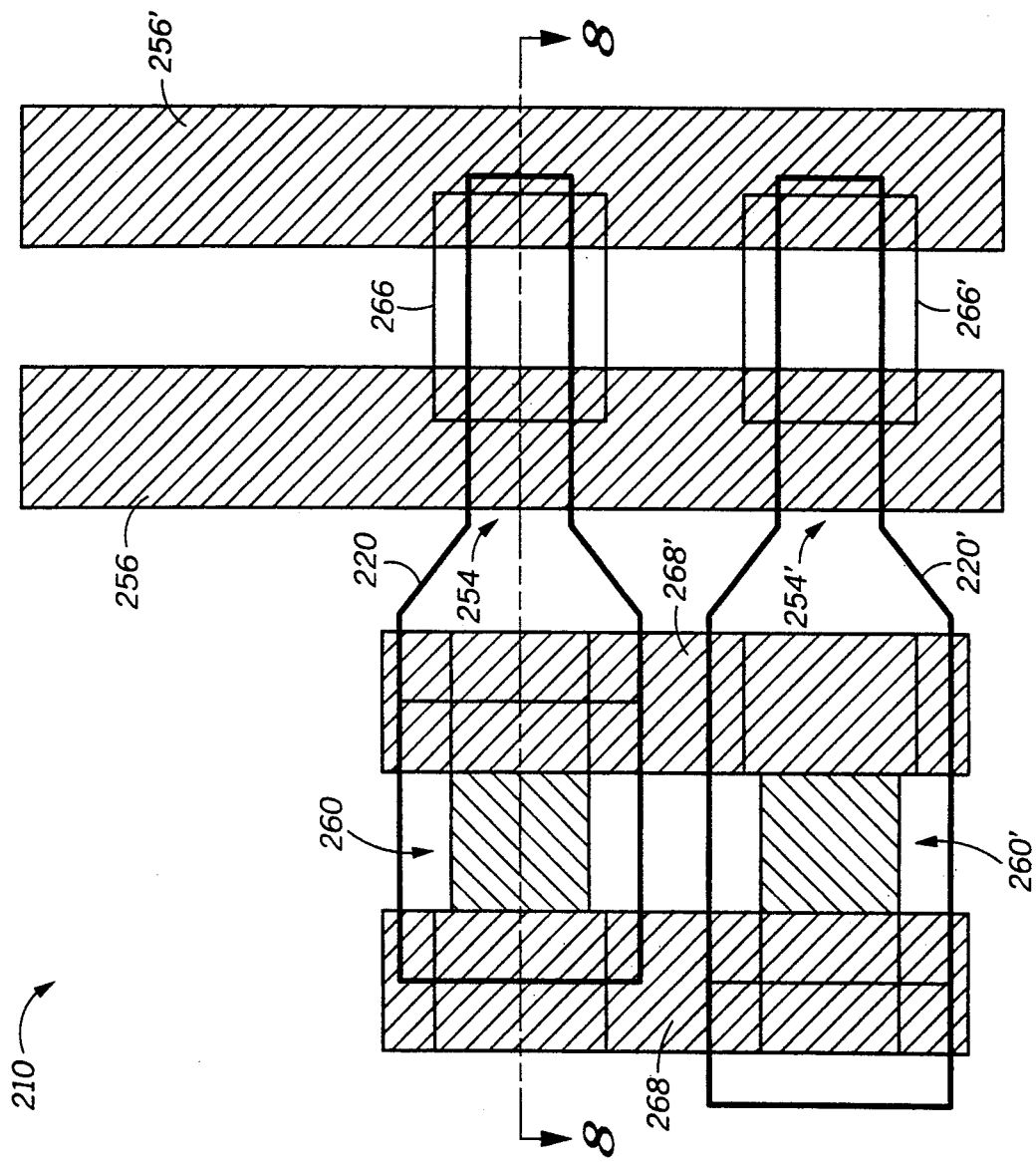
FIG. 9, is a plan view of a semiconductor memory device in accordance with the third embodiment of the invention.

A memory cell 210, according to a third embodiment of the invention, is illustrated, in FIGS. 8 and 9. FIG. 8 is a cross-sectional view taken along the section line 8—8 shown in FIG. 9. In this embodiment, a single wordline configuration is integrated with an inverter 260. Inverter 260 is substantially contained within a trench 224. Inverter 260 includes a driver transistor 232 and a load transistor 242 and is fabricated according to the procedures previously described for the construction of inverter 160. Buried layers 214, 216, 218, and well region 220 are fabricated according to the procedures previously described for buried layers 14, 16, and 18. Memory cell 210 has an access transistor 254, the gate of which is formed by a section of a wordline 256 overlying well region 220. An adjacent wordline 256' provides a wordline signal to an adjacent memory cell (not shown). A bit-line contact land 266 overlies a portion of wordlines 256 and 256' and contacts source region 262 of access transistor 254. A cell interconnect 268 is in contact with a drain region 250 of load transistor 242.

A plan view of memory cell 210 is shown in FIG. 9. Inverter 260 resides in trench 224 which is intermediate to cell interconnects 268 and 268'. Access transistor 254 is formed where wordline 256 crosses over well region 220. Bit-line contact land 266 overlies a portion of both wordline 256 and adjacent wordline 256'. As in the foregoing memory cell embodiments, cell 210 is symmetrical and thus has corresponding features formed in an opposite well region 220'. The direct connection of cell interconnects 268 and 268' to the drain regions of load transistors 242' and 242 respectively, enables a further reduction in cell area. As depicted in FIG. 8, placing cell interconnect 268 on the opposite side of inverter 260 from access transistor 254 permits access transistor 254 to be formed in close proximity to inverter 260. The long dimension of well regions 220 and 220' can be reduced permitting many memory cells to be formed in a given surface area.

Those skilled in the art appreciate that memory cell 210 in accordance with a third embodiment of the invention, utilizes three conductive layers to form the gate electrodes, wordlines, and contact lands. By using three separate conductive layers, the lateral dimensions of the memory cell are further reduced beyond that possible using only two conductive layers.

Thus it is apparent that there has been provided, in accordance with the invention, a semiconductor memory cell which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different insulators and dielectric material, different doping atoms and annealing processes, and different etching processes can be employed without departing from the spirit of the invention. Furthermore, the inverter structure and process can be used in other kinds of devices such as logic devices and the like. It is therefore intended to include within the invention all such variations and modifications as fall within the scope of the appended claims and equivalents thereof.

I claim:

1. A semiconductor memory device comprising:
   a substrate having a surface;
   a well region in the substrate;
   a trench in the substrate, the trench having a bottom surface and a wall surface and a central region;
   an inverter in the trench, the inverter having a first channel region of a first conductivity type in the wall surface, a second channel region of a second conductivity type in the central region extending from the bottom surface to substrate surface, and a toroidal shared-gate electrode intermediate to the first and second channel regions;
   a first buried layer in the substrate electrically coupled to the second channel region at the bottom surface of the trench; and
   a second buried layer in the substrate intermediate to the well region and the first buried layer and electrically coupled to the first channel region,
   wherein the first buried layer provides a first logic signal to the first channel region and the second buried layer provides a second logic signal to the second channel region.

2. The semiconductor memory device of claim 1 further comprising a wordline overlying a portion of the well region and separated therefrom by a gate dielectric layer, the wordline providing electrical control to an underlying portion of the well region for electrically coupling a bit-line signal to the second channel region of the inverter.

3. The semiconductor memory device of claim 1, wherein the second channel region comprises a thin-film layer having a source region at the bottom surface of the trench, a drain region extending outward from the trench, the drain region overlying a portion of the well region adjacent to the trench and contacting the well region.

4. The semiconductor memory device of claim 1, wherein the first channel region comprises:
 a source region defined by a portion of the second buried layer along the wall surface of the trench;
 a drain region defined by a doped region in the well region surrounding the trench at the substrate surface; and
 a channel region along the wall surface of the trench intermediate to the source region and the drain region.

5. A semiconductor memory device comprising:
 a substrate having a well region;
 a trench in the well region having a wall surface and a bottom surface;
 a first channel region formed in the substrate along the wall surface of the trench;
 a first upper drain region and a first lower source region in the substrate on either side of the first channel region;
 a shared gate electrode overlying the wall surface and a portion of the bottom surface and separated from the wall surface and the bottom surface by a first dielectric layer;
 a thin-film layer filling a central portion of the trench and isolated from the shared gate electrode by a second dielectric layer;
 a second channel region in the thin-film layer;
 a second upper drain region and a second lower source region in the thin-film layer on either side of the second channel region, wherein the second lower source region contacts the substrate at the bottom surface of the trench;
 a first buried region in the substrate contacting the second lower source region at the bottom of the trench; and
 a second buried region in the substrate contacting the first lower source region, wherein a first logic signal is provided to the thin-film layer by the first buried region and a second logic signal is provided to the first lower source region by the second buried region.

6. The semiconductor memory device of claim 5, wherein the second upper drain region extends out of the trench and contacts the first upper drain region.

7. The semiconductor memory device of claim 5 further comprising a wordline overlying a portion of the well region adjacent to the trench defining an access transistor, wherein the access transistor provides a bit-line signal to the first upper drain region.

8. A semiconductor memory device comprising:
 a semiconductor substrate;
 first and second opposed well regions in the substrate;
 a first trench in the first well region and a second trench in the second well region, each trench having a bottom surface, a wall surface, and a central region;
 an inverter in each trench, each inverter having a toroidal shared-gate electrode, a thin-film load transistor in the central portion of the trench and a driver transistor in the wall surface of the trench;
 a first cell interconnect integral with the shared-gate electrode of the first inverter, extending away from the first well region and electrically coupled to the second well region;

a second cell interconnect integral with the shared-gate electrode of the second inverter, extending away from the second well region and electrically coupled to the first well region;
 a first buried layer of a first conductivity type in the substrate in contact with the thin-film load transistor at the bottom surface of each trench; and
 a second buried layer of a second conductivity type underlying the first and second well regions and contacting the wall surface of the first and second trenches,
 wherein the first buried layer provides a first logic signal to the thin-film load transistor and the second buried layer provides a second logic signal to the driver transistor.

9. The semiconductor memory device of claim 8 further comprising: wordline overlying a portion of the first well region and a portion of the second well region, wherein the wordline defines a first access transistor in the first well region and a second transistor in the second well region.

10. The semiconductor memory device of claim 9 further comprising a conductive bit-line contact land overlying and electrically isolated from a portion of the wordline, wherein the contact land contacts a portion of the well region adjacent to the wordline.

11. The semiconductor memory device of claim 9, wherein the first cell interconnect contacts a portion of the thin-film load transistor in the second well region, and wherein the second cell interconnect contacts a portion of the thin-film load transistor in the first well region.

12. The semiconductor memory device of claim 9, wherein the first cell interconnect contacts a portion of the second well region intermediate to the second trench and the wordline, and wherein the second cell interconnect contacts a portion of the first well region intermediate to the first trench and the wordline.

13. The semiconductor memory device of claim 8 further comprising:
 first and second parallel opposed wordlines,
 wherein the first wordline overlies a portion of the first well region and extends to the second well region and overlies a portion of the thin-film load transistor in the second trench,
 and wherein the second wordline overlies a portion of the second well region and extends to the first well region and overlies a portion of the thin-film load transistor in the first trench.

14. The semiconductor memory device of claim 13, wherein the first cell interconnect contacts a portion of the second well region intermediate to the second trench and the first wordline, and wherein the second cell interconnect contacts a portion of the first well region intermediate to the first trench and the second wordline.

15. The semiconductor memory device of claim 13 further comprising:
 a first conductive bit-line contact land overlying and electrically isolated from a portion of the first wordline, wherein the contact land contacts a portion of the first well region adjacent to the first wordline; and
 a second conductive bit-line contact land overlying and electrically isolated from a portion of the second wordline, wherein the contact land contacts a portion of the second well region adjacent to the second wordline.

* * * * *